United States Patent [19] [11] 4,369,207
Matsumura et al. [45] Jan. 18, 1983

[54] PROCESS FOR PRODUCTION OF LAMINATED FILM STRUCTURE OF AROMATIC POLYESTER

[75] Inventors: Shunichi Matsumura, Hachioji; Hiroo Inata; Makoto Ogasawara, both of Hino, all of Japan

[73] Assignee: Teijin Limited, Osaka, Japan

[21] Appl. No.: 122,664

[22] Filed: Feb. 19, 1980

[30] Foreign Application Priority Data

Feb. 23, 1979 [JP] Japan ................................. 54-19660
Sep. 7, 1979 [JP] Japan ............................... 54-114097

[51] Int. Cl.³ .......................... B05D 3/06; B29C 19/02
[52] U.S. Cl. ................................. 427/54.1; 156/275.5; 204/159.14; 204/159.15; 525/21; 525/10; 525/35
[58] Field of Search ..................... 427/54.1; 156/272; 428/458; 204/159.15, 159.14; 525/21, 10, 35

[56] References Cited

U.S. PATENT DOCUMENTS

| | | | |
|---|---|---|---|
| 3,926,639 | 12/1975 | Rosen et al. | 204/159.15 |
| 4,196,066 | 4/1980 | Inata et al. | 204/159.15 |
| 4,256,558 | 3/1981 | Inata et al. | 204/159.19 |
| 4,269,947 | 5/1981 | Inata et al. | 525/10 |

Primary Examiner—Marion McCamish
Assistant Examiner—E. Rollins Buffalow
Attorney, Agent, or Firm—Sherman & Shalloway

[57] ABSTRACT

A laminated film structure composed of a polyester film and an electroconductive metal layer laminated to at least one surface of the polyester resin film, characterized in that said polyester film is an unstretched film of a cured aromatic polyester having a crosslinking degree of not less than 70%, a swelling degree of not more than 30 and an elongation at room temperature of not less than 10%; and a process for producing said film structure.

8 Claims, No Drawings

PROCESS FOR PRODUCTION OF LAMINATED FILM STRUCTURE OF AROMATIC POLYESTER

This invention relates to a laminated film structure which is composed of an aromatic polyester film and an electroconductive metal layer laminated to at least one surface of the polyester film and which has various improved properties such as superior mechanical properties, electrical properties, thermal stability, chemical resistance and dimensional stability.

More specifically, this invention relates to a laminated film structure composed of a polyester film and an electroconductive metal layer laminated to at least one surface of the polyester resin film, characterized in that said polyester film is an unstretched film of a cured aromatic polyester having a crosslinking degree of not less than 70%, a swelling degree of not more than 30 and an elongation at room temperature of not less than 10%; and to a process for producing said film structure.

Laminated film structures composed of an electrically insulating resin film such as a stretched (oriented) polyester film, a polyimide film or a glasscloth-epoxy resin laminated film, and an electroconductive metal layer laminated onto at least one surface of the film have been used widely in the field of electronics as a flexible circuit, tape carrier, etc. Polyester films, particularly polyethylene terephthalate films, have superior mechanical properties and electrical properties, but their thermal stability is not sufficient. For example, a stretched film of polyethylene terephthalate has a high shrinkage even at a temperature below its melting point, for example at 230° C., and its range of application is very much limited. Its chemical resistance and dimensional stability are inferior to other resins, for example thermosetting resins. A polyimide film has superior mechanical properties and thermal stability. But its equilibrium water content is high, and its dimensional stability and electrical properties are not satisfactory. Moreover, the polyimide film must be formed from a solution, and this greatly increases its cost. Furthermore, the glasscloth-epoxy resin laminated film is a thermosetting resin, and has the defect of possessing low elongation and lacking flexibility.

The present inventors have made investigations in order to provide a laminated film structure of an aromatic polyester which can overcome the disadvantages of the aforesaid conventional laminated film structures, especially laminated aromatic polyester film structures useful in the field of electronics.

These investigations have led to the discovery that a laminated polyester film structure having superior flexibility, a low equilibrium water content, superior electrical properties and high thermal stability comparable to that of thermosetting resin can be provided by utilizing an unstretched film of a crosslinked aromatic polyester derived from a saturated linear aromatic polyester and having the aforesaid properties as the polyester film layer in the aforesaid film structure.

It has also been found that such a laminated structure having high delamination strength can be produced, without the need to interpose an adhesive layer, by providing an electroconductive metal layer directly on one surface of an unstretched film of an uncured polyester composed of a saturated linear aromatic polyester containing a photopolymerizable crosslinking component, and subjecting the resulting structure to the irradiation of actinic light, preferably ultraviolet light; and that the resulting laminated film structure of aromatic polyester has moderate elongation and flexibility at room temperature and feasible strength and dimensional stability at high temperatures.

The aforesaid cured polyesters and film thereof are disclosed, for example, in German Laid-Open Patent Publications DOS No. 2745906 (laid open on Apr. 13, 1978) and DOS No. 2829572 (laid open on Jan. 11, 1979). Those crosslinked polyesters which are disclosed in these German Publications and have the properties specified hereinabove can also be used in the present invention. These German patent documents, however, do not disclose the utilization of such a film, especially an unstretched film, in metal laminated film structures for electronics applications, and the excellent improvements achieved by such film structures.

It is an object of this invention therefore to provide a laminated film structure of an aromatic polyester having excellent improved properties which are useful, for example, in the field of electronics, and a process for its production.

The above and other objects and advantages of this invention will become more apparent from the following description.

The laminated film structure of this invention composed of a polyester film and an electroconductive metal layer laminated to at least one surface of the polyester film is characterized in that the polyester film is unstretched, and composed of a cured aromatic polyester having a crosslinking degree of not less than 70%, a swelling degree of not more than 30 and an elongation at room temperature of not less than 10%.

The crosslinking degree, swelling degree and elongation in this invention are determined by the following methods.

Crosslinking Degree

One hundred milligrams of a crosslinked polyester film is added to 10 ml of a mixture of phenol and tetrachloroethane in a weight ratio of 60:40, and the mixture is stirred at 140° C. for 30 minutes. Then, the insoluble matter is collected by filtration, washed with acetone and dried. The amount of the resulting insoluble matter is determined, and expressed by weight percent based on the crosslinked polyester film. This amount in percent by weight is defined as the crosslinking degree. Thus, for example, a crosslinking degree of 70% means that the amount of an insoluble portion in 100 mg of a crosslinked polyester film is 70 mg.

Swelling Degree

One hundred milligrams of a crosslinked polyester film is allowed to stand at 140° C. for 30 minutes in 10 ml of a mixture of phenol and tetrachloroethane in a weight ratio of 60:40. Then, the phenol/tetrachloroethane mixture adhering to the surface of the film is wiped off, and the weight (W mg) of the film is measured. The film is washed, and dried, and its weight (G mg) is measured. The swelling degree is calculated as follows:

$$\text{Swelling degree} = (W - G)/G$$

Elongation at Room Temperature

Measured at room temperature at a stretching speed of 100%/min.

The cured aromatic polyester film used in this invention has a crosslinking degree of not less than 70%, a swelling degree of not more than 30, and an elongation at room temperature of not less than 10%. When the crosslinking degree is less than 70% or the swelling degree is more than 30, the crosslinking of the film is insufficient, and the film has unsuitable thermal stability for use as a flexible print circuit, etc. If the elongation at room temperature of the film is less than 10%, its flexibility is not satisfactory. The crosslinking degree is preferably at least 80%, more preferably at least 85%, especially preferably at least 90%. The swelling degree is preferably not more than 20, more preferably not more than 10, especially preferably not more than 5. Furthermore, the above elongation at room temperature is preferably at least 20%, more preferably at least 30%, especially preferably at least 50%.

The cured aromatic polyester film used in this invention has a thickness of preferably not more than about 1000 microns, more preferably not more than about 500 microns, especially preferably not more than about 300 microns, and most preferably not more than about 200 microns. The lower limit of the film thickness is desirably about 10 microns. Preferably, the film has good transparency.

In a preferred embodiment of this invention, an example of the crosslinked aromatic polyester is an aromatic polyester cured by irradiation of actinic light, preferably ultraviolet light, which is composed of (A) a saturated linear aromatic polyester in which at least 70 mole%, preferably at least 80 mole%, of the acid component consists of an aromatic dicarboxylic acid or its functional derivative and (B) a photopolymerizable crosslinking component in an amount of 0.1 to 50 parts by weight per 100 parts by weight of the saturated linear aromatic polyester.

In the aforesaid preferred embodiment, examples of the acid component that can be utilized in forming the saturated linear aromatic polyester (A) include terephthalic acid, isophthalic acid, naphthalenedicarboxylic acid, diphenyldicarboxylic acid, diphenylsulfonedicarboxylic acid, diphenoxyethanedicarboxylic acid, diphenyletherdicarboxylic acid, methylterephthalic acid, and methylisophthalic acid. Of these, terephthalic acid is most preferred.

Other carboxylic acids may be used in an amount of not more than 30 mole%, preferably not more than 20 mole%, together with the aromatic dicarboxylic acid as the acid component. Examples of such carboxylic acids are aliphatic dicarboxylic acids such as succinic acid, adipic acid, sebacic acid, decanedicarboxylic acid or dodecanedicarboxylic acid; alicyclic dicarboxylic acids such as hexahydroterephthalic acid; hydroxycarboxylic acids such as ε-hydroxycaproic acid, hydroxybenzoic acid and hydroxyethoxybenzoic acid; and ester-forming derivatives of these, such as their lower alkyl esters or aryl esters.

Examples of the glycol component of the polyester (A) include ethylene glycol, trimethylene glycol, tetramethylene glycol, neopentylene glycol, hexamethylene glycol, decamethylene glycol, cyclohexane dimethylol, 2,2-bis(β-hydroxyethoxyphenyl)propane, hydroquinone, and 2,2-bis(hydroxyphenyl)propane. Of these, ethylene glycol and tetramethylene glycol are especially preferred.

The polyester (A) has an intrinsic viscosity [η], measured at 35° C. in o-chlorophenol, of preferably at least 0.4, more preferably at least 0.5.

The saturated linear aromatic polyester used in this invention can be produced in a customary manner by reacting the acid component and glycol component exemplified hereinabove. This reaction can be performed, for example, at a temperature of about 150° to 320° C. at atmospheric pressure in a stream of an inert gas or under reduced pressure. It is preferred to use a catalyst in this reaction. Examples of suitable polymerization catalysts are antimony compounds, germanium compounds and titanium compounds. If desired, the polyester may contain copolymerized therein a monofunctional compound such as benzoic acid or benzoylbenzoic acid or a polyfunctional compound such as pentaerythritol, trimethylolpropane, pyromellitic acid or trimellitic acid in amounts which do not substantially cause a loss of its linearity.

The photopolymerizable crosslinking component (B) which is included in the saturated linear aromatic polyester (A) in the aforesaid preferred embodiment by blending and/or copolymerization is, for example, a compound which has an allyl or substituted allyl group of the following formula

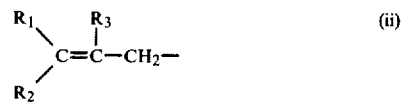

wherein $R_1$, $R_2$ and $R_3$ are identical or different, and each represents a group selected from the class consisting of hydrogen, alkyl groups having 1 to 6 carbon atoms, preferably 1 to 3 carbon atoms, and cycloalkyl groups having 5 to 12 carbon atoms, said allyl or substituted allyl group being stable under the conditions of forming a film of the aromatic polyester (A) by melt-shaping, and which optionally contains at least one ester-forming functional group. Preferred groups of formula (ii) above include allyl, methallyl and crotyl groups.

That the allyl or substituted allyl group is stable under the melt-shaping conditions means that when the above compound is maintained at a temperature at which the polyester is melted, for example at a temperature 20° C. higher than the melting point of the polyester, in an inert gas for about 15 minutes, the allyl or substituted allyl groups are present stably without any reaction taking place between these unsaturated groups or between the unsaturated groups and the polyester.

Examples of preferred ester-forming functional groups which can be copolymerized with the aromatic polyester (A) under the melt-shaping conditions for film formation are epoxy groups of the formula

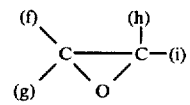

wherein bonds (f) to (i) are bonded to hydrogen atoms or alkyl groups with 1 to 6 carbon atoms, and bond (i) or bonds (i) and (g) are organic moieties which come within formula (ii).

Inclusion of aliphatic unsaturated groups such as allyl or substituted allyl into the polyester can be achieved by copolymerizing and/or mixing the polyester with the compound (B) having the aliphatic unsaturated groups. When the compound (B) is to be copolymerized with the polyester, it should be stable without being decomposed under the copolymerization conditions, and also contain at least one (preferably two) ester-forming functional group (e.g., carboxyl, hydroxyl) or groups capable of generating an ester-forming functional group under the polymerization conditions in addition to the aforesaid unsaturated groups. Preferably, the latter-mentioned functional group is, for example, the epoxy group expressed by the above formula. When the compound (B) is to be incorporated into the polyester, the aliphatic unsaturated groups in the compound (B) are stable under the conditions of melt-blending with the polyester, and also the compound (B) itself is desirably stable. Accordingly, when the compound (B) is to be melt-blended, it is desirable that an insoluble material not soluble in a mixture of phenol and tetrachloroethane at 35° C. should not substantially form in the resulting composition, and the intrinsic viscosity of the polyester should not be markedly decreased. Compounds which are decomposed or gasified at the polyester melting temperature are not desirable in blending with the polyester. From the standpoint of gasification, compounds having a vapor pressure of not more than 100 mmHg, preferably not more than 50 mmHg, especially preferably not more than 10 mmg, at the polyester melting temperature are desirable.

Those compounds (B) which do not have the aforesaid ester-forming functional group should desirably contain at least 2, preferably 3 to 4, groups of formula (ii) in the molecule. Those compounds (B) which contain the aforesaid ester-forming functional group should desirably contain at least 1, preferably 2 groups of formula (ii) and at least 1, preferably 2, ester-forming functional groups.

Specific examples of preferred photopolymerizable crosslinking compounds (B) are shown below.

As compounds having an aliphatic unsaturated group and being capable of blending with the polyester, those having at least two groups of formula (ii) are preferred because in the irradiation of actinic light to be described below, they give a firmer crosslinked structure in the laminated film structure. Examples of such compounds are given below.

[I] Derivatives of cyanuric acid or isocyanuric acid:

Triallyl (or tricrotyl or trimethallyl) isocyanurate, diallyl (or dicrotyl or dimethallyl) methylisocyanurate, diallyl (or dicrotyl or dimethallyl) ethylisocyanurate, ethylenebis[diallyl (or dicrotyl or dimethallyl) isocyanurate], tetramethylenebis[diallyl (or dicrotyl or dimethallyl) isocyanurate], hexamethylenebis[diallyl (or dicrotyl or dimethallyl) isocyanurate], decamethylenebis[diallyl (or dicrotyl or dimethallyl) isocyanurate], oxydiethylenebis[diallyl (or dicrotyl or dimethallyl) isocyanurate], triallyl (or tricrotyl or trimethallyl) cyanurate, diallyl (or dicrotyl or dimethallyl) methylcyanurate, diallyl (or dicrotyl or dimethallyl) ethylcyanurate, tetramethylenebis[diallyl (or dicrotyl or dimethallyl) cyanurate], hexamethylenebis[diallyl (or dicrotyl or dimethallyl) cyanurate], decamethylenebis[diallyl (or dicrotyl or dimethallyl) cyanurate], and oxydiethylenebis[diallyl (or dicrotyl or dimethallyl) cyanurate].

The above compounds can be easily synthesized, for example, by the methods shown in Zh Organ Khim, 2, (10), pp. 1742-3 (1965) (Russ), or J. Am. Chem. Soc., 73, page 2999 (1951).

[II] Carboxylic acid esters

Diallyl terephthalate, diallyl isophthalate, diallyl methylterephthalate, diallyl methylisophthalate, triallyl trimellitate, triallyl trimesate, and tetrallyl pyromellitate.

[III] Compounds having an epoxy group as the ester-forming functional group:

Diallyl glycidyl cyanurate, diallyl glycidyl isocyanurate, allyl diglycidyl cyanurate, allyl diglycidyl isocyanurate; the corresponding cyanuric or isocyanuric acid derivatives resulting from substitution of a crotyl or methallyl group for the allyl groups in the above-exemplified compounds; and the corresponding cyanuric or isocyanuric acid derivatives resulting from substitution of a 2,3-epoxy-2-methylpropyl group, a 2,3-epoxybutyl group, a 2,3-epoxy-2-methylbutyl group, etc. for the glycidyl groups in the above-exemplified compounds.

Among the above compounds having an aliphatic unsaturated groups [polymerizable crosslinking component (B)], those which can be mixed during the shaping step are preferred. The compounds exemplified under [I] and [III] above are more preferred, and the compounds exemplified under [I] above are most preferred.

The compounds exemplified in German DOS No. 2745906 and DOS No. 2829572 can also be used.

Preferably, the unstretched film of an uncured aromatic polyester composed of (A) a saturated linear aromatic polyester in which at least 70 mole% of the acid component consists of an aromatic dicarboxylic acid and (B) a photopolymerizable crosslinking component in an amount of 0.1 to 50 parts by weight per 100 parts by weight of the saturated linear aromatic polyester further includes a photo-reaction initiator. Examples of the photo-reaction initiator are aromatic ketones, benzil, benzil derivatives, benzoin, benzoin derivatives, and polynuclear quinones. Specific examples of these compounds are benzophenone, 4-methylbenzophenone, 4-nitrobenzophenone, 3-methylbenzophenone, 4,4'-dimethylbenzophenone, 3,3'-dimethylbenzophenone, 3,4'-dimethylbenzophenone, 4-phenylbenzophenone, 3-phenylbenzophenone, 3,3'-dinitrobenzophenone, 4,4'-dinitrobenzophenone, 3-nitrobenzophenone, 4-methoxybenzophenone, 3-methoxybenzophenone, 4,4'-dimethoxybenzophenone, bis(4-diphenyl)ketone, bis(3-diphenyl)ketone, 3,4-dimethylbenzophenone, 3,4,3',4'-tetramethylbenzophenone, Michler's ketone, anthraquinone, nitroanthraquinone, phenanthraquinone, acetophenone, propiophenone, benzil, benzoin, benzoin methyl ether, benzoin ethyl ether, benzoin propyl ether, benzoin butyl ether, benzoin phenyl ether, α-methylbenzoin methyl ether, α-phenylbenzoin ethyl ether, α-benzylbenzoin ethyl ether, benzil dimethyl ketal, benzil diethyl ketal, benzil dipropyl ketal, benzil ethylene ketal benzil trimethylene ketal, benzil neopentylene ketal, benzil bis(2-methoxyethyl)ketal, naphthylphenyl ketone, bisnaphthyl ketone, ethylenebis(benzoyl benzamide), tetramethylenebis(benzoyl benzamide), hexamethylenebis(benzoyl benzamide), decamethylenebis(benzoyl benzamide), dodecamethylenebis(benzoyl benzamide), hexamethylenebis(4-acetylbenzamide), hexamethylenebis[(4-methylbenzoyl)benzamide], ethylenebis[(4-nitrobenzoyl)benzamide], dodecamethylenebis[(4-methoxybenzoyl)benzamide], dibenzoyl benzene, bis(4-methylbenzoyl)benzene, ethylenebis(benzoyl phenyl ether), bis(benzoyl methyl) ether, tris(benzoyl phenoxy)benzene, and bis(4-methoxybenzoyl methyl ether). Furthermore, those photo-reaction initiators which are described in German DOS Nos. 1769168, 1769853, 1807297, 1807301, 1919078, and 1949010 and which are substantially stable under the polyester melting conditions can be used in this invention as desired.

It is also possible to copolymerize the polyester with benzophenone-4,4'-dicarboxylic acid. Among the photo-reaction initiators exemplified above, benzil and its derivatives are preferred. The benzil derivatives are especially preferred because of their high activity. Furthermore, among the aromatic ketones those having two or more benzophenone residues are preferred because of their high activity.

The amount of the photopolymerizable crosslinking component (B) is preferably 0.1 to 50 parts by weight per 100 parts by weight of the aromatic polyester. In particular, in the case of compounds containing aliphatic unsaturated groups such as allyl or substituted allyl in the preferred embodiment described hereinabove, the amount may be about 0.01 to 0.5 equivalent, preferably 0.03 to 0.4 equivalent, especially preferably about 0.06 to 0.3 equivalent, per 100 g of the polymer. The amount of the photo-reaction initiator is about 0.01 to 20 parts by weight, preferably 0.05 to 10 parts by weight, more preferably 0.1 to 5 parts by weight, especially preferably about 0.1 to 3 parts by weight, per 100 parts by weight of the polyester (A).

Compounds which contain the aliphatic unsaturated groups mentioned above and have a photo-reaction initiating action can also be used as the crosslinking component (B). Examples include N-allyl (or crotyl or methallyl)benzoyl benzamide, N-allyl (or crotyl or methallyl)anthraquinonecarboxamide, N-allyl (or crotyl or methallyl)benzoyl phthalimide, N,N-diallyl (or dicrotyl or dimethallyl)benzoyl benzamide, and N,N'-diallyl (or dicrotyl or dimethallyl)benzophenonetetracarboxamide.

The laminated film structure of this invention can be obtained by forming an electroconductive metal layer on at least one surface of the cured unstretched polyester film obtained by crosslinking treatment. This can be accomplished by various means. It can also be obtained by providing an electroconductive metal layer directly on at least one surface of an unstretched film of uncured aromatic polyester and subjecting the resulting structure to irradiation of actinic light such as ultraviolet light.

In any of the embodiments described above, lamination is performed after or while an unstretched film of uncured polyester composed of the saturated linear aromatic polyester (A) and the photopolymerizable crosslinking component (B) preferably with a photo-reaction initiator is formed. For example, a photopolymerizable crosslinking component having aliphatic unsaturated groups such as allyl or substituted allyl and/or a photo-reaction initiator may be included in the polyester (A) by copolymerization, and the mixture, molded into a film form. Or the component (B) and the photo-reaction initiator may be blended with the polyester (A), and the blend, molded into a film form.

In the former embodiment in which the aliphatic unsaturated groups and/or the photo-reaction initiator are included in the polyester by copolymerization, the polyester-forming acid component and glycol component, the compound (B) having reactive groups and/or the photo-reaction initiator are reacted by known polyester-forming means. There can also be used a master batch method in which a polyester is prepared in advance by copolymerizing an excess of the aliphatic unsaturated groups and/or the photo-reaction initiator, and is melt-blended with a polyester not containing the aliphatic unsaturated groups and/or the photo-reaction initiator.

In the latter case in which the aliphatic unsaturated groups and/or the photo-reaction initiator are included into the polyester by blending, the polyester (A), the compound (B) having aliphatic unsaturated groups and/or the photo-reaction initiator are mixed by a mechanical mixing means such as an S-type blender or V-type blender. Then, by using a kneader such as an extruder, the two are blended uniformly at a temperature at which the polyester is molten or at a higher temperature, preferably at the melting point of the polyester to a temperature about 60° C. higher than the melting point.

The resulting polyester (A) containing the photopolymerizable crosslinking component (B) and optionally the photo-reaction initiator is then melted, and continuously formed into an unstretched film of uncured polyester by usual methods of molding the thermoplastic resins, such as extrusion molding.

By subjecting the resulting unstretched film of uncured polyester (A) containing the photopolymerizable crosslinking component (B) and optionally the photo-reaction initiator to a crosslinking treatment, there can be obtained an unstretched film of cured polyester having a crosslinking degree of not less than 70%, a swelling degree of not more than 30, and an elongation at room temperature of not less than 10%.

The crosslinking treatment is preferably the irradiation of actinic light such as ultraviolet light, electron beams and radioactive rays. The use of ultraviolet light is especially preferred.

Ultraviolet light is irradiated at room temperature to a temperature lower than the decomposition temperature of the polyester (A), preferably from the second order transition point ($T_g$) to the melting point ($T_m$) of the polyester (A), more preferably from ($T_g+10$) to $T_m$ (°C.), especially preferably from ($T_g+10$) to ($T_m-10$) for a period of 1 second to 10 hours, preferably 2 seconds to 1 hour, more preferably 5 seconds to 30 minutes, particularly preferably from 10 seconds to 10 minutes.

Reinforcing materials such as glass fibers, mica or talc may be included in the crosslinked polyester film used in this invention. This can be easily achieved, for examples, by mixing a reinforcing material as well as the crosslinking component (B) and optionally the photo-reaction initiator with the polyester (A), melt-extruding the mixture, and then subjecting the product to the aforesaid crosslinking treatment. It is also possible to melt and impregnate the polyester (A) containing the crosslinking component (B) and optionally the photo-reaction initiator in a glass cloth, and subjecting the impregnated glass cloth to the crosslinking treatment. This affords a crosslinked polyester film having superior dimensional stability and thermal stability.

The laminated film structure of this invention can be obtained by forming an electroconductive metal layer on at least one surface of the unstretched film of cured polyester which can be obtained in the aforesaid manner. Or it may be formed by providing an electroconductive metal layer directly on at least one surface of the unstretched film of uncured polyester before the crosslinking treatment, and subjecting the resulting assembly to the crosslinking treatment.

The former embodiment of forming the electroconductive metal layer can be performed by various means which can be roughly classified into a type in which an electroconductive metal foil is bonded to the crosslinked polyester film through an adhesive layer, and a type in which an electroconductive metal layer is deposited on the cured polyester film by electroless plating.

Copper, aluminum, etc. are used as the electroconductive metal layer. A copper foil is especially preferred. The copper foil includes both an electrolytic copper foil and a rolled copper foil, and generally the electrolytic copper foil is used. The rolled copper foil is preferred when flexibility is required. When the adhesive is used, it is preferred to use a surface-oxidized copper foil having good adhesiveness. It is also possible to use a combination of electroless plating and electroplating in the formation of an electroconductive metal layer, especially a copper layer, on the cured polyester film.

The method of lamination by bonding is used widely, and can be used also in preparing the laminated film structure of this invention. Preferred adhesives are those which have good adhesion to the cured polyester film and the electroconductive metal foil and have superior electrical properties and thermal stability. Adhesives generally used for polyesters can be directly applied to the preparation of the laminate film structure of this invention. Preferred examples are urethane-modified polyester-type adhesives, and polyester-modified epoxy-type adhesives. The urethane-modified ester-type adhesives are particularly preferred.

The bonding can be performed, for example, by continuously applying a solution of such an adhesive to the cured polyester film by coating means such as a roll coater, heating the coated film to remove the solvent, and pressing the conductive metal foil against the coated surface by a hot roller. For example, the cured polyester film and the conductive metal foil are bonded preferably under the following conditions of laminating temperature $T_L$ (°C.) and laminating pressure G (kg/cm$^2$).

$$T_P\left(1 - \frac{2}{\ln P}\right) \leq T_L \leq T_P\left(1 + \frac{2}{\ln P}\right)$$

$$\frac{\ln P}{2} \leq G \leq 10 \ln P$$

In the above expressions, $T_P$ is the temperature at which the viscosity of the adhesive is at least 10 poises but below 1000 poises; P is the viscosity of the adhesive at temperature $T_P$, and lnP is the natural logarithm of P.

The laminate film structure of this invention can be produced with commercial advantage by the above method.

The laminate film structure can also be produced by forming the conductive metal layer by electroless plating. For example, a copper layer can be formed on the cured polyester film by activating the surface of the cured polyester film by a known method, and then dipping the film in an electroless copper plating bath. A copper layer having a thickness of less than about 10 microns can be formed by electroless plating alone. If a thicker copper layer is required, electroplating is performed to the desired thickness after the electroless plating. In order to increase the adhesion of the polyester film to the copper foil, it is preferred to perform soft etching, such as treatment with amines, on the film.

According to the latter-mentioned embodiment of forming the electroconductive metal layer, it is possible to provide the electroconductive metal layer directly on at least one surface of the unstretched film of uncured polyester and then subjecting the resulting structure to crosslinking treatment.

According to this embodiment, the conductive metal foil is bonded to the unstretched film of uncured polyester film containing the crosslinking component (B) by coating means such as a hot press roller or laminator, and then to subject the resulting structure to crosslinking treatment as described above. Association of the base polyester film and the electroconductive metal foil can be achieved after the molding of the unstretched polyester film and before the crosslinking treatment of the polyester film. For example, there can be used a so-called extrusion laminating method which comprises laminating the metal foil to the polyester film during the melt-extrusion of the polyester, and a method which comprises melt-extruding the polyester into a film and bonding the metal foil and the film with a hot press roller.

In the extrusion laminating method, in order to increase the adhesion between the polyester layer and the metal layer, it is preferred to perform bonding with a hot press roller when the temperature of the polyester reaches a predetermined point described hereinbelow after the polyester has been cast on the metal foil.

Preferably, the temperature (TH, °C.) at which the metal foil and the unstretched film of the uncured polyester with a hot press roller should be within the range specified by the following equations depending upon the weight percent (W) of the photopolymerizable crosslinking component (B).

$$0.89W^2 - 24W + 250 \leq TH \leq -6W + 250$$

$$TH \geq 40$$

The bonding pressure is at least 2 kg/cm$^2$, preferably at least 3 kg/cm$^2$ and especially preferably at least 5 kg/cm$^2$ but does not exceed 250 kg/cm$^2$, preferably 150 kg/cm$^2$, especially preferably 100 kg/cm$^2$. The time required for bonding with a roller is at least about 0.5 second, preferably at least about 1 second. The bonding conditions are desirably varied depending upon the material of the surface of the roll within the above-specified conditions. The material of which the surface of the roll is made affects the appearance of the outside surface of the polyester film layer of the laminate film structure obtained by bonding. Such a material should withstand continuous long-term use at the bonding temperature TH. For example, it may be a hard-plated polished roll, a silicone rubber-lined roll, or a Teflon-lined roll.

A multiplicity of roller units at different heating temperatures and pressures may be used in order to perform the heat bonding of the laminate film structure more effectively.

The laminate film structure of this invention can be produced by irradiating actinic light, preferably ultraviolet light, onto the polyester layer of the laminated structure to cure the polyester.

According to this invention, the firm bonding between the electroconductive metal layer and the unstretched polyester film layer and the curing of the polyester can be performed simultaneously by the aforesaid embodiment in which the adhesive layer is not used. The conditions for ultraviolet radiation may be the same as those used in the first-mentioned embodiment in which the adhesive layer is used.

The laminated polyester film structure obtained by the above bonding and crosslinking treatment can be used directly. The adhesion between the layers can be further increased by heat-treating the resulting laminate film structure at a temperature of at least about 150° C., preferably at least about 180° C., more preferably at least about 210° C., for at least about 10 seconds, preferably at least about 30 seconds, more preferably at least about 1 minute but not exceeding 60 minutes, preferably about 30 minutes. This heat-treatment may be carried out in hot air. To inhibit oxidation of the bonded metal foil, however, it is convenient to apply infrared heating from the side of the polymer layer of the laminated film structure.

If desired, a glass cloth layer may be provided on that surface of the laminated film structure of this invention which is opposite to the surface having the electroconductive metal layer. In the performance of this embodiment, the uncured polyester film containing the crosslinking component (B), a glass cloth and an electroconductive metal foil are bonded by a hot press roller, a laminator, etc., and the polyester in the resulting laminated structure is cured by irradiation of actinic light, particularly ultraviolet light.

The sequence of lamination of the individual layers is, for example, such that the electroconductive metal foil (M), the unstretched film of uncured polyester (P) and the glass cloth (G) are arranged in this order (M.P.G. arrangement), or a four layer structure of M.P.G.P. in this order is provided. A preferred method of lamination, for example, comprises melt-extruding the polyester from a shaping die having a predetermined clearance, and while the film is not fully cooled, laminating the metal foil to one surface of the unstretched polyester film and the glass cloth to the other surface (the extrusion-laminating method); or first forming the unstretched film of uncured polyester, and then bonding the glass cloth to one surface of the film and the metal foil to the other by using a hot press roller.

In the above extrusion-laminating method, too, it is recommended for increased adhesion between the unstretched film of uncured polyester and the metal or glass cloth that the bonding with a hot press roller should be carried out when the temperature of the polyester reaches the predetermined temperature point specified hereinabove. When the lamination is performed by the M.P.G.P. four-layer method, it is preferred to bond a composite film structure of M.P.G. to the unstretched film of uncured polyester film (P), or a laminate film of M.P. to a laminate film of G.P., using a hot press roller. Also, when the unstretched film of uncured polyester is first formed and then the conductive metal foil (M) or glass cloth (G) is laminated thereto by means of a hot press roller, it does not matter whether the required layers are laminated in the predetermined sequence and bonded at a time, or they are laminated and bonded one by one. To perform lamination economically on an industrial scale, however, it is advantageous to bond all the required layers at a time.

In the bonding of the polyester film, glass cloth and conductive metal foil by a hot press roller, the temperature (TH), the pressure, the type of roll used, etc. may be the same as those described with regard to the first-mentioned embodiment.

The conditions for curing the uncured polyester in the structure by ultraviolet irradiation, and for heat-treatment may be the same as those described hereinabove with regard to the aforesaid embodiment.

The laminated film structure of this invention composed of an unstretched film of cured polyester having a crosslinking degree of not less than 70%, a swelling degree of not more than 30 and an elongation at room temperature of not less than 10% and an electroconductive metal layer laminated to at least one surface of the polyester film has superior thermal stability and dimensional stability, and can, for example, be soldered at a temperature of more than about 260° C., and even more than about 300° C. The adhesion between the unstretched cured polyester film layer and the metal layer is high, and the delamination strength is at least 1 kg/cm, especially at least 1.5 kg/cm.

The electroconductive laminated film structure of this invention can be utilized in materials which require both thermal stability and flexibility, such as flexible print circuits, tape carriers and panel heaters.

The following examples further illustrate the present invention. All parts in these examples are by weight. The intrinsic viscosity of polymer is measured at 35° C. in o-chlorophenol. The flexural strength is evaluated by bending a sample at a radius of curvature of 0.4 mm and observing the bended state with the naked eye.

EXAMPLES 1 TO 3 AND COMPARATIVE EXAMPLE 1

One hundred parts of polyethylene terephthalate (intrinsic viscosity 0.65) having copolymerized therewith 15%, based on the total glycol component, of cyclohexane-1,4-dimethanol was well blended by an S-type blender with the crosslinking agents and photo-reaction initiators shown in Table 1 in the amounts indicated. The mixture was melt-extruded from a T-die to form a transparent amorphous film having a thickness of about 100 microns. The film was exposed to light from a 2 KW high-pressure mercury lamp (30 W/cm) at a distance of 20 cm at 130° C. for 3 minutes to form a cured polyester film.

The film was degreased with acetone, and an adhesive having the following composition was coated on one surface of the film by a bar coater (No. 20).

| Composition of the adhesive | |
|---|---|
| RV-300 (a trademark, Toyobo Co., Ltd.) | 100 parts |
| Epikote 28 (a trademark, Shell Chemical Co.) | 10 parts |
| Coronate L (a trademark, Japan Polyurethane Industry) | 10 parts |
| Toluene | 300 parts |

The coated film was treated at 170° C. for 5 minutes to remove the toluene. An electrolytic copper foil having a thickness of 35 microns was applied to the cured film and the assembly was heat-bonded between two hot rollers kept at 150° C. The resulting structure was further heat-treated at 170° C. for 10 minutes to cure the adhesive layer. The crosslinking degree, swelling degree and elongation at room temperature of the cured film, the thermal stability of the laminated film structure, and the delamination strength of the copper foil are shown in Table 1.

TABLE 1

| | Crosslinking agent | Photo-reaction initiator | Cured film | | | Laminated film | | |
|---|---|---|---|---|---|---|---|---|
| | | | Crosslinking degree (%) | Swelling degree | Elongation at room temperature (%) | Solder resistance (260° C., 30 seconds) | Delamination strength (kg/cm) (*) | Flexibility |
| Example 1 | Triallyl cyanurate (15 parts) | Benzil dimethyl ketal (2 parts) | 95 | 2 | 60 | No change | 1.5 | Good |
| Example 2 | Triallyl isocyanurate (20 parts) | Benzophenone (2 parts) | 90 | 3 | 45 | No change | 1.6 | Good |
| Example 3 | Triallyl trimellitate (18 parts) | Benzil ethylene ketal (2 parts) | 88 | 4 | 80 | No change | 1.4 | Good |
| Comparative Example 1 | Biaxially stretched film of polyethylene terephthalate (non-cured type) | | | | 70 | The film was melted. | 1.2 | Good |

*Delamination strength: measured in the direction of 180°.

Table 1 also shows the results obtained with a laminate film comprising a biaxially stretched film of polyethylene terephthalate for comparison.

It is seen from Table 1 that the laminated film structures of this invention have superior solder resistance because of the use of the highly cured polyester film, and good flexibility because of having a sufficient elongation.

EXAMPLE 4

One hundred parts of polybutylene terephthalate having an intrinsic viscosity of 0.70 was mixed well by an S-type blender with 20 parts of ethylenebis(diallyl isocyanurate) as a crosslinking agent and 1 part of benzil dimethyl ketal as a photo-reaction initiator. The mixture was melt-extruded from a T-die, and quenched to obtain a transparent film having a thickness of 120 microns. The film was subjected to the irradiation of light from a 2 KW high-pressure mercury lamp (30 W/cm) at a distance of 10 cm at 150° C. for 2 minutes to form a cured film. The cured film was degreased with acetone, and an adhesive having the following composition was coated on one surface of the film by a bar coater (No. 20).

| Composition of the adhesive | |
|---|---|
| RV-300 | 100 parts |
| Coronate L | 12 parts |
| Toluene | 250 parts |

The coated film was heat-treated at 170° C. for 5 minutes, and a surface oxidized copper foil having a thickness of 35 microns was heat-bonded with the film at 170° C. The crosslinked film of polybutylene terephthalate used as a base film had a crosslinking degree of 98%, a swelling degree of 1, and an elongation at room temperature of 30%. The delamination strength in the 180° direction of the copper foil was 1.5 kg/cm, and the solder resistance (260° C., 30 seconds) of the laminate film was good with no change observed. When the resulting laminate structure was dipped in trichloroethylene for 5 minutes, no change was observed.

EXAMPLE 5

One hundred parts of polyethylene terephthalate (intrinsic viscosity 0.78) having copolymerized therewith 15%, based on the total acid component, of isophthalic acid and 30%, based on the total glycol component, of neopentylene glycol was blended well by an S-type blender with 5 parts of diallyl glycidyl isocyanurate and 15 parts of hexamethylenebis(diallyl isocyanurate) as a crosslinking agent and 2 parts of benzil ethylene ketal as a photo-reaction initiator. The mixture was melt-extruded from a T-die to form a transparent amorphous film having a thickness of about 50 microns. The resulting film was subjected to the irradiation of light from a 2 KW high-pressure mercury lamp at 130° C. for 5 minutes to form a cured film having a crosslinking degree of 88%, a swelling degree of 3.5 and an elongation at room temperature of 120%. The cured film was dipped for 1 minute in a 50% aqueous solution of monoethylamine, washed with water, dried, and then degreased with acetone. An adhesive having the following composition was coated on the film by a bar coater (No. 20).

| Composition of the adhesive | |
|---|---|
| RV-300 | 100 parts |
| Epikote 815 (a trademark, Shell Chemical Co.) | 10 parts |
| Coronate L | 5 parts |
| Toluene | 300 parts |

The coated film was dried at 170° C. for 5 minutes, and an electrolytic copper foil having a thickness of 35 microns was heat-bonded at 150° C. The delamination strength of the copper foil was 1.8 kg/cm, and no change was noted in the laminated film structure in a solder resistance test conducted at 260° C. for 30 seconds. When the film was dipped in acetone or trichloroethylene for 5 minutes, no change was noted in the film. The laminated film structure also had good flexibility.

EXAMPLE 6

Polybutylene terephthalate (intrinsic viscosity 0.70) was melted in an extruder, and a mixture of triallyl cyanurate and benzophenone (weight ratio 6:1) as a crosslinking agent was introduced into the extruder from a side pipe provided therein for blending of the crosslinking agent. Thus, the polybutylene terephthalate was mixed in the extruder with triallyl cyanurate and benzophenone. The mixture was extruded from a T-die, and quenched to afford a transparent film having a thickness of about 100 microns. The film was then subjected to the irradiation of light from a 2 KW high-pressure mercury lamp (30 W/cm) at a distance of 20 cm at 130° C. for 5 minutes to form a cured film having a crosslinking degree of 95%, a swelling degree of 1.5 and an elongation at room temperature of 50%. The cured film was dipped for 1 minute in a 50% aqueous solution of monoethylamine at room temperature, and washed with water. The film was further dipped for 10 minutes in HS-101B (a sensitizer for electroless copper plating, a product of Hitachi Chemical Co., Ltd.), and washed with water. Furthermore, it was dipped for 5 minutes in ADP-201 (a bonding promoter, a product of Hitachi Chemical Co., Ltd.) and washed with water. Subsequently, the film was dipped at 25° C. for 15 minutes in an electroless copper plating bath (CUST-201), washed with water, and then subjected to copper electroplating using a copper sulfate bath. There was obtained a laminate film copper-clad on both surfaces and having a copper layer thickness of about 30 microns. In the laminated film, the delamination strength in the 180° direction of the copper layer was 0.9 kg/cm. When it was subjected to a solder resistance test at 260° C. for 30 seconds, no change was noted in the laminated film.

EXAMPLES 7 TO 10

Polyethylene terephthalate (intrinsic viscosity 0.74) having copolymerized therewith 15 mole%, based on the total acid component, of isophthalic acid was fully dried, and metered and fed into a vent-equipped extruder having two screws of 30 mm in diameter adapted to rotate in different directions. The polymer was thus melted within the cylinders. The crosslinking agent and photo-reaction intiator shown in Table 2 were fed into the extruder from the vent portion using a metering pump. The molten polymer was intimately blended with these additives, and the uniform intimate blend was conducted to a T-die, and extruded onto a cooled drum to form a transparent amorphous film having a thickness of about 100 microns. The film and a copper foil (for use in a print circuit board) having a thickness of 35 microns and not coated with an adhesive were bonded by two hot rollers lined with a silicone rubber under the bonding conditions shown in Table 2. The polyester film layer was subjected to irradiation of ultraviolet light from a 2 KW high-pressure mercury lamp (20 W/cm) at a distance of 20 cm for 3 minutes to cure it, and then heat-treated at each of the temperatures shown in Table 2. The resulting laminated film structure was tested for delamination strength, and also subjected to a solder resistance test at 260° C. for 30 seconds. The reults are shown in Table 2.

EXAMPLES 11 AND 12

Polyethylene terephthalate (intrinsic viscosity 0.72) having copolymerized therewith 15 mole%, based on the total acid component, of isophthalic acid and 20 mole%, based on the total glycol component, of neopentylene glycol was blended with the crosslinking agent and photo-reaction initiator shown in Table 2 and formed into a film in the same way as in Example 7.

Laminated film structures were prepared from the resulting films in the same way as in Example 7. The laminated film structures were tested for delamination strength, and also subjected to a solder resistance test at 260° C. for 30 seconds. The results are shown in Table 2.

COMPARATIVE EXAMPLES 2 AND 3

An attempt was made to bond a copper foil to a film obtained by the same procedure as in Example 7 or Example 11 except that the crosslinking agent and photo-reaction initiator were not added to the polymer of Example 7 (Comparative Example 2) or the polymer of Example 11 (Comparative Example 3). The copper foil scarcely adhered to the film.

TABLE 2

|  | Example 7 | Example 8 | Example 9 | Example 10 |
|---|---|---|---|---|
| Type and amount (wt. %) of crosslinking agent | Triallyl cyanurate (14) | Triallyl cyanurate (10) Diallyl glycidyl isocyanurate (2) | Triallyl cyanurate (15) | Triallyl isocyanurate (16) |
| Type and amount (wt. %) of photo-reaction initiator | Benzil dimethyl ketal (2) | Benzil dimethyl ketal (2) | Benzoin ethyl ether (2) | Benzil dimethyl ketal (2) |
| Bonding temperature (°C.) | 120 | 120 | 120 | 120 |
| Bonding pressure (kg/cm²) | 5 | 5 | 5 | 5 |
| Delamination strength immediately after crosslinking (kg/cm) | 1.5 | 1.6 | 1.5 | 1.5 |
| Heat-treating temperature (°C.) | 220 | 235 | 220 | 220 |
| Delamination strength after heat-treatment (kg/cm) | 1.7 | 2.0 | 1.6 | 1.6 |
| Solder resistance test (260° C., 30 sec.) | Good | Good | Good | Good |
| Delamination strength after solder resistance test (kg/cm) | 1.7 | 2.0 | 1.6 | 1.6 |

|  | Example 11 | Example 12 | Comparative Example 2 | Comparative Example 3 |
|---|---|---|---|---|
| Type and amount (wt. %) of crosslinking agent | Triallyl cyanurate | Triallyl cyanurate | — | — |

TABLE 2-continued

|  | (15) | (10)<br>Diallyl<br>glycidyl<br>isocyanurate<br>(2) |  |  |
|---|---|---|---|---|
| Type and amount (wt. %) of photo-reaction initiator | Benzil dimethyl ketal (2) | Benzil dimethyl ketal (2) | — | — |
| Bonding temperature (°C.) | 110 | 110 | 120 | 110 |
| Bonding pressure (kg/cm²) | 5 | 5 | 5 | 5 |
| Delamination strength immediately after crosslinking (kg/cm) | 1.5 | 1.6 | 0.2 | 0.2 |
| Heat-treating temperature (°C.) | 235 | 220 | — | — |
| Delamination strength after heat-treatment (kg/cm) | 1.6 | 1.7 | — | — |
| Solder resistance test (260° C., 30 sec.) | Good | Good | — | — |
| Delamination strength after solder resistance test (kg/cm) | 1.7 | 1.7 | — | — |

EXAMPLES 13 TO 16

Polyethylene terephthalate (intrinsic viscosity 0.74) having 15 mole%, based on the total acid component, of isophthalic acid copolymerized therewith was fully dried, and then metered and fed into a vent-equipped extruder having two screws of 30 mm in diameter adapted to rotate in different directions. Thus, the polymer was melted in the cylinder, and each of the crosslinking agents and each of the photo-reaction initiators shown in Table 3 were introduced into the extruder by means of a metering pump. The polymer and the additives were blended intimately, and the intimate uniform blend was conducted to a T-die and extruded onto a cooled drum to form a transparent amorphous film having a thickness of about 100 microns.

The resulting film (P), a commercially available plain-weave glass cloth (G) having a thickness of 30 microns, and a copper foil (M) (for use in a print circuit board) having a thickness of 35 microns and not coated with an adhesive were bonded by using two hot rollers lined with a silicone rubber under the bonding conditions shown in Table 3. The polyester layer was then subjected to irradiation of ultraviolet light from a 2 KW high-pressure mercury lamp (30 W/cm) at a distance of 20 cm for 3 minutes to cure it, and then heat-treated at each of the temperatures shown in Table 3 to form an electroconductive composite film. The composite film was tested for delamination strength and subjected to a solder resistance test at 260° C. for 30 seconds.

Two markers with a distance of about 10 cm from each other were provided in the composite film, and the distance between the markers was measured after the solder resistance test. Dimensional changes (%) were determined from the results of measurement.

The flexural resistance of the resulting composite film structure was examined by bending the film sample, holding it with fingers to maintain a bent state, and then returning it to the original state.

The results are shown in Table 3.

EXAMPLES 17 AND 18

Polyethylene terephthalate (intrinsic viscosity 0.72) having 15 mole%, based on the total acid component, of isophthalic acid and 20 mole%, based on the total glycol component, of neopentylene glycol copolymerized therewith was blended with each of the crosslinking agents and each of the photo-reaction initiators shown in Table 3 and formed into a film in the same way as in Example 13.

Electroconductive laminated film structures were prepared from the resulting films in the same way as in Example 13. The delamination strengths and solder resistances of these film structures were determined. The results are shown in Table 3.

COMPARATIVE EXAMPLES 4 AND 5

An attempt was made to bond a copper foil to a film obtained in the same way as in Example 13 or 17 except that the polymer of Example 13 (Comparative Example 4) or the polymer of Example 17 (Comparative Example 5) was used without blending a crosslinking agent and a photo-reaction initiator. The metal foil scarcely adhered to the film.

TABLE 3

|  | Example 13 | Example 14 | Example 15 | Example 16 | Example 17 | Example 18 | Comparative Example 4 | Comparative Example 5 |
|---|---|---|---|---|---|---|---|---|
| Type and amount (wt. %) of crosslinking agent | Triallyl cyanurate (14) | Triallyl cyanurate (10) and diallyl glycidyl isocyanurate (2) | Triallyl cyanurate (15) | Triallyl cyanurate (16) | Triallyl cyanurate (15) | Triallyl cyanurate (10) and diallyl glycidyl isocyanurate (2) | — | — |
| Type and amount (wt. %) of photo-reaction initiator | Benzil dimethyl ketal (2) | Benzil dimethyl ketal (2) | Benzoin ethyl ether (2) | Benzil dimethyl ketal (2) | Benzil dimethyl ketal (2) | Benzil dimethyl ketal (2) | — | — |
| Bonding temperature (°C.) | 120 | 120 | 120 | 120 | 110 | 110 | 120 | 120 |
| Bonding pressure (kg/cm²) | 10 | 10 | 10 | 10 | 10 | 10 | 10 | 10 |

TABLE 3-continued

|  | Example 13 | Example 14 | Example 15 | Example 16 | Example 17 | Example 18 | Comparative Example 4 | Comparative Example 5 |
|---|---|---|---|---|---|---|---|---|
| Type of lamination | M.P.G | M.P.G | M.P.G.P | M.P.G.P | M.P.G | M.P.G | M.P.G | M.P.G.P |
| Delamination strength immediately after crosslinking (kg/cm) | 1.5 | 1.6 | 1.5 | 1.5 | 1.5 | 1.6 | 0.2 | 0.2 |
| Heat-treatment temperature (°C.) | 220 | 235 | 220 | 220 | 235 | 220 | — | — |
| Delamination strength after heat-treatment (kg/cm) | 1.7 | 2.0 | 1.6 | 1.6 | 1.6 | 1.7 | — | — |
| Solder resistance test (260° C., 30 seconds) | Good | Good | Good | Good | Good | Good | — | — |
| Delamination strength after the solder resistance test (kg/cm) | 1.7 | 2.0 | 1.6 | 1.6 | 1.7 | 1.7 | — | — |
| Dimensional change after the solder resistance test (%) | 0.3 | 0.3 | 0.2 | 0.2 | 0.3 | 0.3 | — | — |
| Flexural resistance | Not broken | Not broken | Not broken | Not broken | Not broken | Not broken | — | — |

What we claim is:

1. A process for producing a laminated film structure, which comprises forming an electroconductive metal layer directly on one surface of a melt-shaped and unstretched film of an uncured polyester composed of (A) a saturated linear aromatic polyester in which at least 70 mole% of the acid component consists of an aromatic dicarboxylic acid and (B) a photopolymerizable crosslinking component in an amount of 0.1 to 50 parts by weight per 100 parts by weight of the saturated linear aromatic polyester (A) wherein said photopolymerizable crosslinking component (B) is at least one compound containing at least one allyl or substituted allyl group stable under the melt-shaping conditions for the formation of a film from said aromatic polyester (A), said allyl or substituted allyl group being expressed by the following formula

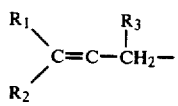

wherein $R_1$, $R_2$ and $R_3$ are identical or different and each represents a group selected from the class consisting of hydrogen, alkyl groups having 1 to 6 carbon atoms and cycloalkyl groups having 5 to 12 carbon atoms, said compound optionally containing at least one ester-forming functional group, and subjecting the resulting structure to the irradiation of ultraviolet light to cure the polyester thereby to form a laminated film structure composed of an unstretched film of a cured polyester having a crosslinking degree of not less than 70%, a swelling degree of not more than 30 and an elongation at room temperature of not less than 10%, and the electroconductive metal layer laminated to at least one surface of the polyester film.

2. The process of claim 1 wherein said compound contains at least one ester-forming functional group which is an epoxy group expressed by the following formula

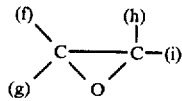

wherein bonds (f) to (i) are bonded to hydrogen atoms or alkyl groups having 1 to 6 carbon atoms, and bond (i) or bonds (i) and (g) are organic moieties which come within formula (ii).

3. The process of claim 1 wherein said photopolymerizable crosslinking component (B) is at least one of said compounds containing at least one allyl or substituted allyl group which are derivatives of cyanuric acid or isocyanuric acid and are selected from the group consisting of triallyl isocyanurate, tricrotyl isocyanurate, trimethallyl isocyanurate, diallyl methylisocyanurate, dicrotyl methylisocyanurate, dimethallyl methylisocyanurate, diallyl ethylisocyanurate, dicrotyl ethylisocyanurate, dimethallyl ethylisocyanurate, ethylenebis[diallyl isocyanurate], ethylenebis[dicrotyl isocyanurate], ethylenebis[dimethallyl isocyanurate], tetramethylenebis[diallyl isocyanurate], tetramethylenebis[dicrotyl isocyanurate], tetramethylenebis[dimethallyl isocyanurate], hexamethylenebis[diallyl isocyanurate], hexamethylenebis[dicrotyl isocyanurate], hexamethylenebis[dimethallyl isocyanurate], decamethylenebis[diallyl isocyanurate], decamethylenebis[dicrotyl isocyanurate], decamethylenebis[dimethallyl isocyanurate], oxydiethylenebis[diallyl isocyanurate], oxydiethylenebis[dicrotyl isocyanurate], oxydiethylenebis[dimethallyl isocyanurate], triallyl cyanurate, tricrotyl cyanurate, trimethallyl cyanurate, diallyl methylcyanurate, dicrotyl methylcyanurate, dimethallyl methylcyanurate, diallyl ethylcyanurate, dicrotyl ethylcyanurate, dimethallyl ethylcyanurate, tetramethylenebis[diallyl cyanurate], tetramethylenebis[dicrotyl cyanurate], tetramethylenebis[dimethallyl cyanurate], hexamethylenebis[diallyl cyanurate], hexamethylenebis[dicrotyl cyanurate], hexamethylenebis[dimethallyl cyanurate], decamethylenebis[diallyl cyanurate], decamethylenebis[dicrotyl cyanurate], decamethylenebis[dimethallyl cyanurate], oxydiethylenebis[diallyl cyanurate], oxydiethylenebis[dicrotyl cyanurate], and oxydiethylenebis[dimethallyl cyanurate].

4. The process of claim 1 wherein said photopolymerizable crosslinking component (B) is at least one of said compounds containing at least one allyl or substituted allyl group which are derivatives of carboxylic acid esters which are selected from the group consisting of diallyl terephthalate, diallyl isophthtalate, diallyl methylterephthalate, diallyl methylisophthalate, triallyl trimellitate, triallyl trimesate, and tetrallyl pyromellitate.

5. The process of claim 2 wherein said photopolymerizable crosslinking component (B) is at least one of said compounds containing at least one allyl or substituted allyl group which are compounds having an epoxy group as the ester-forming functional group which are selected from the group consisting of diallyl glycidyl cyanurate, dicrotyl glycidyl cyanurate, dimethallyl glycidyl cyanurate, diallyl glycidyl isocyanurate, dicrotyl glycidyl isocyanurate, dimethallyl glycidyl isocyanurate, allyl diglycidyl cyanurate, crotyl diglycidyl cyanurate, methallyl diglycidyl cyanurate, allyl diglycidyl isocyanurate, crotyl diglycidyl isocyanurate, methallyl diglycidyl isocyanurate, diallyl 2,3-epoxy-2-methylpropyl cyanurate, dicrotyl 2,3-epoxy-2-methylpropyl cyanurate, dimethallyl 2,3-epoxy-2-methylpropyl cyanurate, diallyl 2,3-epoxy-2-methylpropyl isocyanurate, dicrotyl 2,3-epoxy-2-methylpropyl isocyanurate, dimethallyl 2,3-epoxy-2-methylpropyl isocyanurate, allyl di(2,3-epoxy-2-methylpropyl)cyanurate, crotyl di(2,3-epoxy-2-methylpropyl)cyanurate, methallyl di(2,3-epoxy-2-methylpropyl)cyanurate, allyl di(2,3-epoxy-2-methylpropyl)isocyanurate, crotyl di(2,3-epoxy-2-methylpropyl)isocyanurate, methallyl di(2,3-epoxy-2-methylpropyl)isocyanurate, diallyl 2,3-epoxybutyl cyanurate, dicrotyl 2,3-epoxybutyl cyanurate, dimethallyl 2,3-epoxybutyl cyanurate, diallyl 2,3-epoxybutyl isocyanurate, dicrotyl 2,3-epoxybutyl isocyanurate, dimethallyl 2,3-epoxybutyl isocyanurate, allyl di(2,3-epoxybutyl)cyanurate, crotyl di(2,3-epoxybutyl)cyanurate, methallyl di(2,3-epoxybutyl)cyanurate, allyl di(2,3-epoxybutyl)isocyanurate, crotyl di(2,3-epoxybutyl)isocyanurate, methallyl di(2,3-epoxybutyl) isocyanurate, diallyl 2,3-epoxy-2-methylbutyl cyanurate, dicrotyl 2,3-epoxy-2-methylbutyl cyanurate, dimethallyl 2,3-epoxy-2-methylbutyl cyanurate, diallyl 2,3-epoxy-2-methylbutyl isocyanurate, dicrotyl 2,3-epoxyisocyanurate, allyl di(2,3-epoxy-2-methylbutyl)cyanurate, crotyl di(2,3-epoxy-2-methylbutyl)cyanurate, methallyl di(2,3-epoxy-2-methylbutyl cyanurate, allyl di(2,3-epoxy-2-methylbutyl)isocyanurate, crotyl di(2,3-epoxy-2-methylbutyl)isocyanurate, and methallyl di(2,3-epoxy-2-methylbutyl)isocyanurate.

6. The process of claim 1 wherein said uncured polyester further comprises from 0.01 to 20 parts by weight, per 100 parts by weight of the polyester (A) of a photoreaction initiator selected from the group consisting of aromatic ketones, benzil, benzil derivatives, benzoin, benzoin derivatives and polynuclear quinones.

7. The process of claim 1 wherein said photopolymerizable crosslinking component (B) is a compound selected from the group consisting of N-allyl benzoyl benzamide, N-crotyl benzoyl benzamide, N-methallyl benzoyl benzamide, N-allyl anthraquinonecarboxamide, N-crotyl anthraquinonecarboxamide, N-methallyl anthraquinonecarboxamide, N-allyl benzoyl phthalimide, N-crotyl benzoyl phthalimide, N-methallyl benzoyl phthalimide, N,N-diallyl benzoyl benzamide, N,N-dicrotyl benzoyl benzamide, N,N-dimethallyl benzoyl benzamide, N,N'-diallyl benzophenonetetracarboxamide, N,N'-dicrotyl benzophenonetetracarboxamide, N,N'-dimethallyl benzophenonetetracarboxamide.

8. The process of claim 1 wherein said electroconductive metal layer is a copper or aluminum metal layer.

* * * * *